United States Patent [19]

Dorlanne et al.

[11] Patent Number: 5,060,117
[45] Date of Patent: Oct. 22, 1991

[54] TAPE OF CONNECTIONS FOR ASSEMBLY-LINE MOUNTING OF SURFACE-MOUNTED COMPONENTS

[75] Inventors: Olivier Dorlanne; Dominique Petit, both of Dijon, France

[73] Assignee: Compagnie Europeene de Composants Electroniques LCC, Courbevoie, France

[21] Appl. No.: 454,627

[22] Filed: Dec. 21, 1989

[30] Foreign Application Priority Data

Dec. 23, 1988 [FR] France .................................. 8817090

[51] Int. Cl.⁵ .............................................. H05K 5/02
[52] U.S. Cl. ..................................... 361/421; 357/70; 361/306
[58] Field of Search ................... 174/52.4; 357/68–70; 361/306 G, 306 F, 306 DC, 421, 531, 533, 538, 540

[56] References Cited

U.S. PATENT DOCUMENTS

| | | | |
|---|---|---|---|
| 4,003,125 | 1/1977 | Wallick | 29/569 R |
| 4,129,682 | 12/1978 | Stewart et al. | 361/421 |
| 4,400,714 | 8/1983 | Brown | 357/70 |
| 4,497,012 | 1/1985 | Gottlieb et al. | 361/306 |
| 4,539,623 | 9/1985 | Irikura et al. | 361/540 |
| 4,571,662 | 2/1986 | Conquest et al. | 361/540 |
| 4,600,971 | 7/1986 | Rose et al. | 361/421 |
| 4,809,054 | 2/1989 | Waldner | 357/70 |

FOREIGN PATENT DOCUMENTS 0162149 11/1985 European Pat. Off. .
0205360 12/1986 European Pat. Off. .

Primary Examiner—Gregory D. Thompson
Attorney, Agent, or Firm—Oblon, Spivak, McClelland, Maier & Neustadt

[57] ABSTRACT

The disclosure concerns a metallic tape that has been previously cut out and is designed for the mounting of surface-mounted components (SMC), using chips having two metallizations on two opposite faces. Each component position, demarcated by two transversal slots, comprises two external connections, each extended by a contact element. This contact element is characterized by a curved shape, formed by a surface to be soldered and a tongue so that, after folding, to create a space for the component, the surfaces to be soldered overlap partially, forming a clip for the component. The disclosure is applicable to the fabrication of SMC components.

13 Claims, 2 Drawing Sheets

TAPE OF CONNECTIONS FOR ASSEMBLY-LINE MOUNTING OF SURFACE-MOUNTED COMPONENTS

BACKGROUND OF THE INVENTION

1. Field of the Invention

The present invention concerns a tape of connections used during mounting on automated assembly or production lines for SMC, namely surface-mounted components. This tape of connections is adapted to components having two electrodes on two opposite faces of their body. They are either ceramic disk capacitors or varistors, or diode chips or parallelepiped-shaped components.

2. Description of the Prior Art

It is known that surface mounting is a technology providing high gains in productivity, in association with automatic implanting machines, and that this technology prevents the printed circuits or ceramic substrates from being pierced by wires: this is a necessary feature in components having axial or lateral outputs. But it requires the components to be provided with at least two access connections on one and the same face of the component, so that it can be brazed to a face of the supporting substrate. The advantages provided by SMC technology are worthwhile only if the SMC components are themselves produced in large batches on automated assembly lines.

The invention meets this requirement by proposing a metallic tape, suited to assembly line production. This tape, perforated on its edges to provide for its feeding motion and positioning, supports a plurality of sets of previously cut out connections. When considered for one component, a set of connections has two external connection strips, transversal to the tape, each of these strips being fixedly joined to a contact element with a view to being brazed to the component disk. The two contact elements are cut out, in the flat tape, with an imbricated or hooked shape so that, after a double folding which creates the space for inserting the component between them, there is a superimposition of a part of the contact elements which thus form a clip holding the component. The two superimposed parts of the contact elements are further provided with soldering given in an appropriate form (preform, solder paste etc.) in such a way that it suffices to heat it in a through-type furnace or with a micro-soldering machine, after the insertion of the component, for it to be brazed and provided with two external connections, located in one and the same plane and each forming an extension of the other.

SUMMARY OF THE INVENTION

More precisely, the invention concerns a tape of connections for the assembly-line mounting of a plurality of electronic components designed to be surface mounted (SMC), each component taking the form of a chip provided, on its two opposite faces, with two metallizations; a tape of connections, cut out in a metallic strip provided with lateral holes for its on-line positioning, wherein each component position has two external connections defined by two slots, transversal to the strip, each external connection forming an extension of the other, each of the connections being joined by a fold to a contact element formed by a tongue and a surface to be soldered, curved with respect to the tongue, so that a part of a first surface to be soldered overlaps (R) a part of the second surface to be soldered, thus forming a clip which holds the component during the mounting operations, the folds being in opposite directions.

BRIEF DESCRIPTION OF THE DRAWINGS

The invention will be better understood from the following description of an exemplary application, in relation to the appended figures, of which.

DETAILED DESCRIPTION OF THE INVENTION

Figure 1:
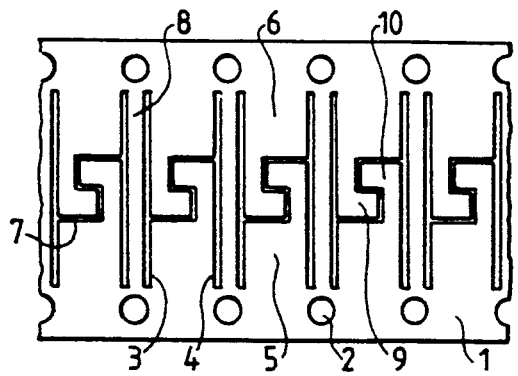
FIG. 1 shows an element of a plane tape of connections after cutting out.

FIG. 1 shows an element of a tape of connections according to the invention: this element corresponds to five positions of components, cut out in a tape designed for several thousands of components.

It is a metallic strip 1, in which the following are cut out by mechanical or chemical means:

holes 2 on the edges of the strip, to provide for its feed motion and for its precise positioning;

slots 3 and 4, parallel to each other and transversal with respect to the strip 1: these slots define the external access connections 5 and 6 of the SMC component.

a cut-out feature 7 between each pair of slots 3 and 4.

The transversal slots 3 and 4, corresponding to an SMC component, are separated from the transversal slots of the two neighboring components by a metallic spacing band 8. This spacing band will subsequently enable each SMC component to be given a mold-coating (namely a coating that closely matches its shape) of synthetic resin. It shall be seen further below that this spacing band 8 may carry pins (shown in FIG. 9) which facilitate the fabrication of the SMC components.

Figure 2:
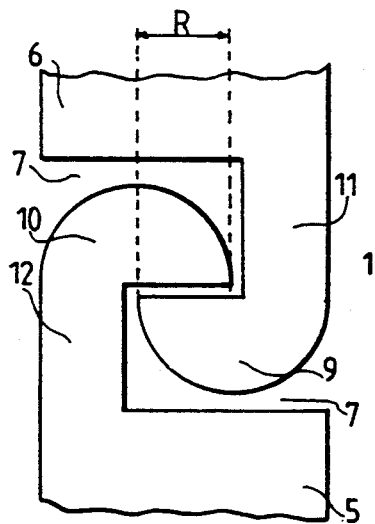
FIGS. 2, 3 and 4 show three variants of the cutting out of contact elements.
Figure 3:
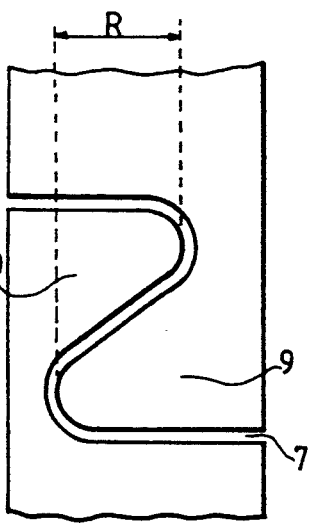
Figure 4:
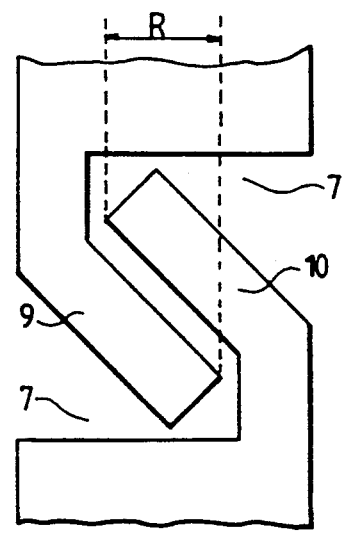

Between each pair of slots 3 and 4, the cut-out feature 7 which reaches the slots has a complex curved shape of a Greek key-pattern as shown in FIG. 1 or hooked as shown in the enlarged details of FIGS. 2 to 4.

This cut-out feature is designed to define contact elements having surfaces 9 and 10 in the metallic strip 1. These contact element surfaces will be subsequently soldered to the two metallized surfaces 30 and 31 of the SMC component.

The contact elements each have an imbricated shape formed (see FIG. 2) by one of the surfaces 9 and 10, and by one of a tongue 11 and 12 which respectively joins the surface 9 and the surface 10 to the external connection 5. The imbricated shape may be obtained by means of a cut in a Greek key-pattern (FIG. 1), a rounded Greek key-pattern (FIG. 2), an S shape (FIG. 3) or two diagonal strips (FIG. 4), for example, although many other shapes can be envisaged.

The only imperative concerning the shape of the cut-out feature 7, apart from that of width to ensure the flow of current, is that it is necessary to obtain an overlapping zone between surfaces 9 and 10, marked R in FIGS. 2 to 5 when, in a subsequent stage, the external connections 5 and 6 and the tongues 11 and 12 will be folded to create the space within which the component disk will be inserted.

Figure 5:
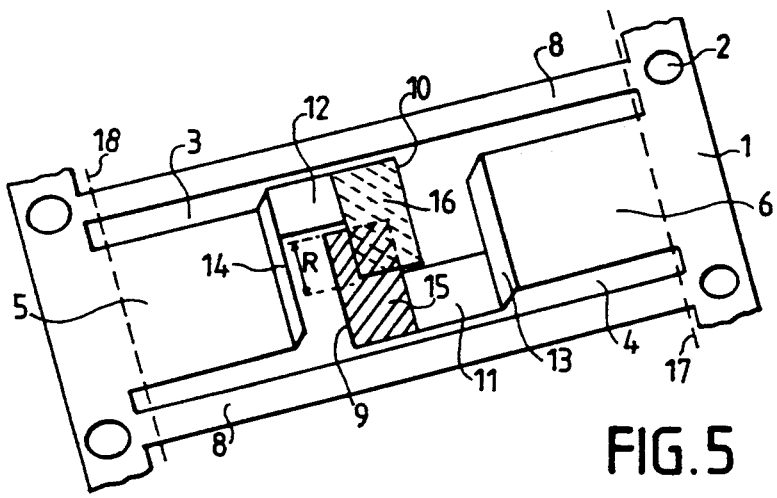
FIG. 5 shows an element of a tape of connections, after folding and soldering.

For, the set of FIGS. 1 to 4 corresponds to a first state of the tape of connections, which is still plane. This tape of connections cannot be used as it is because the contact elements are coplanar. A space has to be created between them by folding, as shown in FIG. 5.

For make it easier to read, this figure shows only one position, for only one component, of the tape of connections but it is shown in a second state, ready for the insertion of a component disk on a fabrication machine.

A double folding of the external connections 5 and 6 and strips 11 and 12 creates two folds 13 and 14, one for each connection. By this operation:

the contact elements move back and the surfaces 9 and 10 overlap each other partially.

a spacing is created between the contact elements. The height of this spacing is set by the preceding fold and is equal to the sum of the heights of the folds 13 and 14 plus the thickness of the tape of connections, if the folding is at right angles.

The last operation consists in providing the surfaces 9 and 10, with a soldering alloy, shown by continuous lines at 15 and by dashes at 16 (it is beneath the surface and, hence, concealed). The soldering alloy may be applied in different ways:

fixing of an alloy preform attached to a surface to be soldered;

fixing of an alloy preform crimped into a surface to be soldered through a hole made in it;

deposition of a soldering cream or of a conductive bonder;

hot-dip tinning, etc.

The tape of connections according to the invention is then ready for use: by means of a crosswise twisting of the tape, the connections are made to move away from one another and a component disk is inserted between them. Then, with the twist removed, the component is soldered to its connections in a through-type furnace or by means of a micro-soldering machine, mold-coated with a synthetic resin and the tape, cut out longitudinally along the dashes 17 and 18, releases the components. All that remains to be done is to fold the connections 5 and 6 against the mold-coating to obtain an SMC component.

Figure 6:
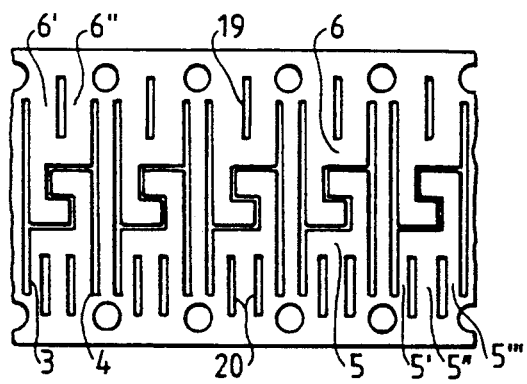
FIG. 6 shows two possible variants, depicted in the same figure, of the cutting out of the external connections.

The following figures show improvements in this tape of connections. For example, in FIG. 6, in its crude cut-out state, the tape of connections may have, for each external connection 5 and 6, either a slot 19 or two slots 20 (both improvements being shown in the same figure, for the purpose of simplification). These slots are parallel to the transversal slots 3 and 4: the slot 19 cuts an external connection 6 into two equal strips 6' and 6", and the slots 20 cut an external connection 5 into three strips 5', 5" and 5"Δ. For the greater stability of the SMC on the printed circuit, it is preferable to have a strip 5" width equal to the sum of the widths 5' and 5"Δ.

Figure 7:
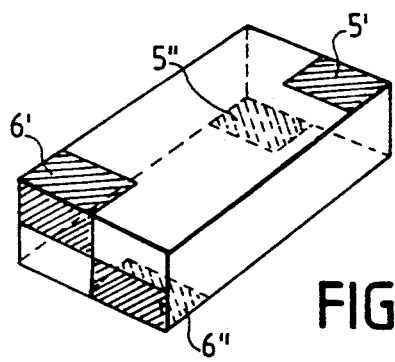
FIGS. 7 and 8 show two three-quarter views in space of two SMC components corresponding to variants of the cutting out modes of FIG. 6.
Figure 8:
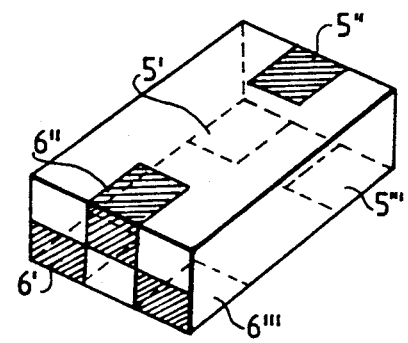

The value thereof is shown in FIGS. 7 and 8. If the external connection is cut into only once (19), the strips may be folded on two main faces of the plastic mold-coating. The SMC component will be fixed either by the connections 5' and 6' or by the connections 5" and 6". It is symmetrical and it is no longer necessary to orient it in order to position it before soldering.

If the external connection is cut into twice (20), the result obtained, in FIG. 8, is the same, but with the additional advantage wherein the SMC component obtained is more stable than that of FIG. 7 because the external connections are aligned: 5' and 6', 5"Δ and 6"Δ on one face, and 5" and 6" on the other face. If the SMC component is more stable, it will be more effectively soldered to a support.

Figure 9:
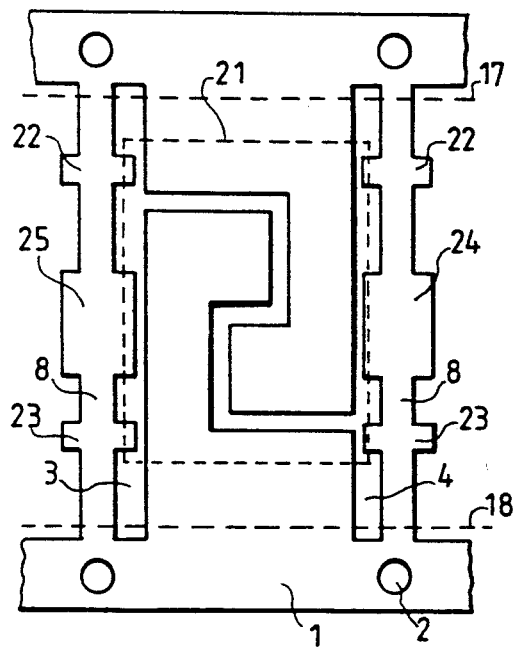
FIG. 9 shows an element of a tape of connections provided with pins for centering the component.

FIG. 9 shows two improvements related to the spacing bands 8. They may be applied simultaneously or independently. A rectangle of dashes 21 shows the future plastic mold-coating of the SMC component. After the mold-coating, the tape of connections is cut out on its edges along 17 and 18, and the SMC components are collected in loose state, as are the spacing bands 8.

A first improvement consists in providing the spacing bands 8 with small pins such as 22 and 23, moving forward in the slots 3 and 4. These pins are positioned so as to be partially coated during the mold-coating and, when the flanks of the connections tape are cut out along 17 and 18, the coated SMC components are no longer loose: they form a chain, the spacing bands 8 of which form joints. This makes it possible, for example, to number the SMC components or to test them. For, it is preferable to test the components before marking them in order to mark only the good ones. A simple pull on a component releases it from the pins 22, 23 and the spacing bands 8.

A second improvement consists in providing the spacing bands 8, in their central part, with pins such as 24 and 25. These pins provide for the centering of component disk when it is inserted between the contact elements.

Figure 10:
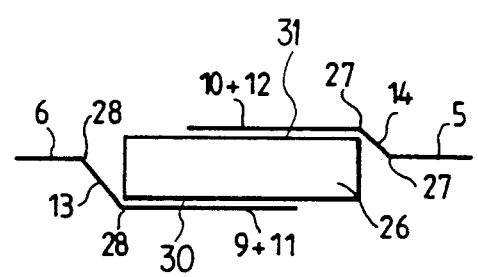
FIG. 10 is a sectional view showing the folding of the tape for the centering of the component.

Another way to center the component disk is shown in FIG. 10 where reference 26 denotes a component disk or chip having metallized surfaces 30 and 31 introduced between the contact elements 9+11 or 10+12. For the solderings to be properly centered, the folding of the external connections 5 and 6 and the tongues 11 and 12 may be checked to ensure that the angles formed at 27 and 28 are not at 90° by adjusting the folding angle, the component disk 26 is self-centered by the folds 13 and 14.

The tape of connections according to the invention has a great many industrial advantages, for it has been designed for a totally automated assembly-line production of SMC components. Through the expedient of folding the connections and tongues, one and the same tape may be suited to components of varied thicknesses, for example to ceramic capacitors with values depending on the thickness of the dielectric. However, by a reduction in the dimensions of the tape of connections, this tape remains adapted to components as small as diode chips. More generally, the invention is suited to all components provided with two electrodes on two opposite faces of a chip, which have to be mounted as surface-mounted components.

What is claimed is:

1. A planar metallic strip which can be bent to accommodate a plurality of electronic surface-mounted components, said metallic strip comprising:
a pair of transverse slots cut through said strip locating a component position between said slots;
a zigzag cut through said strip joining said pair of transverse slots and defining a first contact element on a first side of the cut and a second contact element on a second side of the cut, said first contact element including a first tongue carrying a first surface and said second contact element including a second tongue carrying a second surface, said first and second surfaces extending inwardly from the first and second tongues, respectively, and each of said surfaces extending more than half way across a distance separating said transverse slots.

2. The metallic strip of claim 8, wherein said first and second contact elements are folded along a portion thereof to arrange said first and second surfaces in respective parallel first and second planes, each of said first and second surfaces being intersected by a line normal to said first and second planes when the surfaces are oriented in said first and second planes.

3. The metallic strip of claim 1, wherein a first external connection is connected to said first tongue and a second external connection is connected to said second tongue.

4. The metallic strip of claim 3, wherein said first and second external connections each include at least one slot dividing said external connections into segments, said segments being oriented transversely with respect to said strip.

5. The metallic strip of claim 4, wherein each of said segments is bent either upwardly or downwardly with respect to said strip.

6. The metallic strip of claim 5, wherein said strip includes a plurality of segments bent upwardly with respect to said strip and a plurality of segments bent downwardly with respect to the strip.

7. The metallic strip of claim 6, wherein each of said segments bent upwardly with respect to the strip is adjacent to one of said segments bent downwardly with respect to the strip.

8. The metallic strip of claim 1, wherein a plurality of pairs of transverse slots are cut through the strip separated by spacing bands.

9. The metallic strip of claim 8, wherein at least one of said spacing bands is provided with at least one lateral pin extending partially into at least one of said transverse slots.

10. A metallic strip cut and bent to accommodate a plurality of electronic surface-mounted components, said metallic strip comprising:

a pair of transverse slots cut through said strip locating a component position between said slots;

a zigzag cut through said strip joining said pair of transverse slots and defining a first contact element on a first side of the cut and second contact element on a second side of the cut, wherein said first contact element includes a first tongue carrying a first surface and said second contact element includes a second tongue carrying a second surface, said first and second surfaces extending inwardly from the first and second tongues, respectively, and extending more than half way across a distance separating said transverse slots;

said contact elements being folded along portions thereof to arrange said first and second surfaces in respective parallel first and second planes, and said first and second surfaces each being intersected by a line normal to said first and second planes.

11. The metallic strip of claim 10, wherein said parallel planes are separated by a distance sufficient to receive an electronic surface-mounted component.

12. A metallic strip including a plurality of electronic surface-mounted components, said metallic strip comprising:

a pair of transverse slots cut through said strip locating component positions of the surface-mounted components between said slots;

a zigzag cut-out feature joining said pair of adjacent transverse slots defining a first contact element on a first side of the cut-out feature and a second contact element on a second side of the cut-out feature, said first contact element including a first tongue carrying a first surface to be soldered and said second contact element including a second tongue carrying a second surface to be soldered, wherein said first and second surfaces extend inwardly from the first and second tongues, respectively, said first and second surfaces extending more than half way across a distance separating said transverse slots;

said contact elements being folded along portions thereof to arrange said surfaces in parallel planes; and said first and second surfaces mounting one of said surface-mounted components therebetween.

13. The metallic strip of claim 3, wherein said surface-mounted components each include first and second metallized surfaces which are soldered to said first and second surfaces to be soldered, respectively.

* * * * *